(12) United States Patent
Guo

(10) Patent No.: US 11,108,017 B2
(45) Date of Patent: Aug. 31, 2021

(54) ORGANIC LIGHT EMITTING DIODE DEVICE PACKAGE STRUCTURE AND METHOD OF MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Tianfu Guo, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 214 days.

(21) Appl. No.: 16/464,208

(22) PCT Filed: Nov. 5, 2018

(86) PCT No.: PCT/CN2018/113911
§ 371 (c)(1),
(2) Date: May 24, 2019

(87) PCT Pub. No.: WO2020/077698
PCT Pub. Date: Apr. 23, 2020

(65) Prior Publication Data
US 2021/0104701 A1    Apr. 8, 2021

(30) Foreign Application Priority Data
Oct. 15, 2018   (CN) .......................... 201811198063.7

(51) Int. Cl.
*H01L 31/00* (2006.01)
*H01L 21/00* (2006.01)
(Continued)

(52) U.S. Cl.
CPC ...... *H01L 51/5253* (2013.01); *H01L 27/3246* (2013.01); *H01L 51/0017* (2013.01);
(Continued)

(58) Field of Classification Search
CPC ............. H01L 27/3246; H01L 27/3258; H01L 51/5246
(Continued)

(56) References Cited

U.S. PATENT DOCUMENTS 10,026,793 B2 * 7/2018 Jeon ...................... G09G 3/3233
10,446,786 B2 * 10/2019 Sung ........................ H01L 51/56
(Continued)

FOREIGN PATENT DOCUMENTS

CN         1971940 A     5/2007
CN       107507931 A    12/2017
(Continued)

*Primary Examiner* — Calvin Lee
(74) *Attorney, Agent, or Firm* — Osha Bergman Watanabe & Burton LLP

(57) ABSTRACT

The present disclosure provides an organic light emitting diode display package structure and a method of manufacturing the same. The organic light emitting diode display package structure is provided with a gate insulating layer, a first barrier layer, a first organic buffer layer, a first hydrophobic layer, a second organic buffer layer, and a second barrier layer which are disposed sequentially. A double layer of the organic buffer layer has a thickness capable of wrapping the foreign matters in the area to lower the possibility that the water and oxygen pass through this area and enter OLED device to enhance the protection ability of the TFE on the OLED device.

8 Claims, 3 Drawing Sheets

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC .......... *H01L 51/0097* (2013.01); *H01L 51/56* (2013.01); *H01L 2227/323* (2013.01); *H01L 2251/5338* (2013.01)

(58) Field of Classification Search
USPC ........ 257/98, 100, 449; 438/82–83, 653–654
See application file for complete search history.

(56) References Cited

U.S. PATENT DOCUMENTS

| | | | |
|---|---|---|---|
| 10,615,364 B2 * | 4/2020 | Wang | H01L 51/0031 |
| 10,651,265 B2 * | 5/2020 | Park | H01L 51/5256 |
| 10,720,604 B2 * | 7/2020 | Kim | H01L 51/0031 |
| 2010/0207519 A1 | 8/2010 | Hayashi | |
| 2018/0033830 A1 | 2/2018 | Kim et al. | |
| 2018/0108867 A1 | 4/2018 | Lee et al. | |
| 2019/0172892 A1 * | 6/2019 | Lee | H01L 51/5275 |

FOREIGN PATENT DOCUMENTS

| | | |
|---|---|---|
| CN | 107665062 A | 2/2018 |
| CN | 107968111 A | 4/2018 |
| JP | 2009266922 A | 11/2009 |

\* cited by examiner

ORGANIC LIGHT EMITTING DIODE DEVICE PACKAGE STRUCTURE AND METHOD OF MANUFACTURING SAME

FIELD OF INVENTION

The present invention relates to a display technology field, and more particularly to an organic light emitting diode device package structure and a method of manufacturing the same.

BACKGROUND OF INVENTION

Organic light emitting diodes (OLED) are also call organic electro-laser displays or organic light-emitting semiconductors. An OLED has a basic structure including a thin and transparent indium tin oxide (ITO), with semiconductor properties, which is connected to a positive pole of electricity and additional metal cathode to form a sandwich structure. The whole structure layers include a hole transport layer (HTL), a electroluminescence layer (EL), and an electron transport layer (ETL). When the power is supplied to an appropriate voltage, the positive holes and the cathode charges are combined in the electroluminescence layer to produce light. Red, green and blue (RGB), the three primary colors are produced depending on the formulation so that a basic color is constructed.

One difference between thin film transistor liquid crystal display (TFT-LCD) and OLED is that the OLED emits light based on its own characteristics, and does not require a backlight, so visibility and brightness are high, followed by low voltage demand and high power saving efficiency, as well as fast response, light weight, thin thickness, simple structure and low cost, the OLED is regarded as one of the most promising products in the 21st century. In particular, OLEDs can be a flexible device formed on a flexible substrate, which is an unique advantage to OLEDs. In order to realize this advantage of OLED (flexible display), thin film encapsulation (referred to as TFE) technology is an essential core technology.

For OLED device, the water and oxygen in an external environment is a main killer, and thus the performance of the water and oxygen resistance is most important for the TFE technology. On this base, it is necessary to take into account the optical penetration and flexible bending properties of the TFE film layer. For OLED devices, the external water and oxygen can invade through two routes. The first routes is that water and oxygen directly penetrate the TFE film layer from top to bottom into the OLED device. The second routes is that water and oxygen enter the etched OLED from the side of the TFE film layer. Therefore, these two routes are prerequisites that must be considered in the design of TFE membrane structure. At present, the foreign matters generated in the process lead to the external water and oxygen entering the OLED device through the second route, which eventually leads to the failure of the TFE package. It is therefore necessary to find out an OLED package structure to effectively wrap the foreign matter generated in manufacturing process to lower the possibility that water and oxygen invade the OLED device.

For solving the above technical problem, the present invention provides an organic light emitting diode device package structure and a method of manufacturing the same to solve the problems that the current water and oxygen is easy to invade the OLED device through the foreign matter generated during manufacturing, and the TFE technology has low protection ability for the LED device.

SUMMARY OF INVENTION

A technical solution for solving the above problems is that the present invention provides an organic light emitting diode display package structure, including a gate insulating layer, a first barrier layer, a first organic buffer layer, a first hydrophobic layer, a second organic buffer layer, and a second barrier layer which are disposed sequentially. The gate insulating layer has thereon a pixel definition layer and a blocking wall, wherein a working area is disposed between a boundary of an effective display area of the pixel definition layer and the blocking wall. The first barrier layer covers on the pixel definition layer and the blocking wall, and the first organic buffer layer is disposed on the first barrier layer over the pixel definition layer. The first hydrophobic layer is disposed on the first organic buffer layer over the working area, wherein the first hydrophobic layer is provided with nano microstructures on a surface for limiting a boundary of the first organic buffer layer. The second organic buffer layer is disposed on the first hydrophobic layer, and the second barrier layer covers on the second organic buffer layer.

Further, intervals between the nano microstructures on the surface of the first hydrophobic layer are less than or equal to 50 μm.

Further, the first hydrophobic layer includes polytetrafluoroethylene.

Further, the nano microstructures on the surface of the first hydrophobic layer are formed by a plasma surface etching.

Further, the first hydrophobic layer is deposited on the first organic buffer layer by a physical vapor deposition.

Further, the first organic buffer layer includes one of an acrylic or an epoxy resin.

Further, the OLED display package structure further includes: a second hydrophobic layer disposed on the second organic buffer layer, wherein a surface of the second hydrophobic layer is provided with nano microstructures for limiting a boundary of the second organic buffer layer; and a third organic buffer layer disposed between the second hydrophobic layer and the second barrier layer.

Further, the organic light emitting diode display package structure further includes a glass substrate, a polyimide substrate and a functional layer which are disposed sequentially, wherein the polyimide substrate is disposed on the glass substrate; the functional layer is disposed between the polyimide substrate and the gate insulating layer.

Further, the functional layer includes a hole transport layer, a luminous layer, and an electron transport layer, wherein the hole transport layer is disposed on the polyimide substrate; the luminous layer is disposed on the hole transport layer; and the electron transport layer is disposed on the luminous layer.

The present invention further provides a method of manufacturing an organic light emitting diode display package structure, comprising steps of: providing a glass substrate; coating polyimide on the glass substrate by a polyimide coating machine to form a polyimide substrate under a high temperature curing; forming a functional layer on the polyimide by a TFT technical process; forming a gate insulating layer on the functional layer by a TFT technical process and providing a pixel definition layer and a blocking wall on the gate insulating layer; disposing a first barrier layer on the pixel definition layer and the blocking wall; disposing a first organic buffer layer on the first barrier layer over the pixel definition layer; disposing a first hydrophobic layer on the first organic buffer layer over the working area and then performing a plasma etching treatment on a surface of the first hydrophobic layer to form nano microstructures on the surface of the first hydrophobic layer; disposing a second organic buffer layer on the first hydrophobic layer; and covering a second barrier layer on the second organic buffer layer.

The present invention relates to an organic light emitting diode device package structure and a method of manufacturing the same. The package structure can effectively limit the flow of the first organic buffer layer during preparing by depositing a hydrophobic layer with nano microstructures within an area from the effective display area to organic buffer blocking layer, and thereby depositing the second organic buffer layer again on the first hydrophobic layer. Thus, a double layer of the organic buffer layer has a thickness capable of wrapping the foreign matters in the area to lower the possibility that the water and oxygen pass through this area and enter OLED device to enhance the protection ability of the TFE on the OLED device.

| | |
|---|---|
| 1: glass substrate | 2: polyimide substrate |
| 3: functional layer | 4: gate insulating layer |
| 5: pixel definition layer | 6: blocking wall |
| 7: first barrier layer | 8: first organic buffer layer |
| 9: first hydrophobic layer | 10: second organic buffer layer |
| 11: second barrier layer | 12: first common layer |
| 13: electro-luminous layer | 14: second common layer |
| 15: second hydrophobic layer | 16: third organic buffer layer |
| 51: effective display area | 52: working area |
| 91: nano microstructures | |

DETAILED DESCRIPTION OF PREFERRED EMBODIMENTS

The detailed description of the following embodiments is used for exemplifying the specific embodiments of the present invention by referring to the accompany drawings. Furthermore, directional terms described by the present invention, such as upper, lower, front, back, left, right, inner, outer, side, etc., are only directions by referring to the accompanying drawings, and thus the directional terms are used to describe and understand the present invention, but the present invention is not limited thereto.

Figure 1:
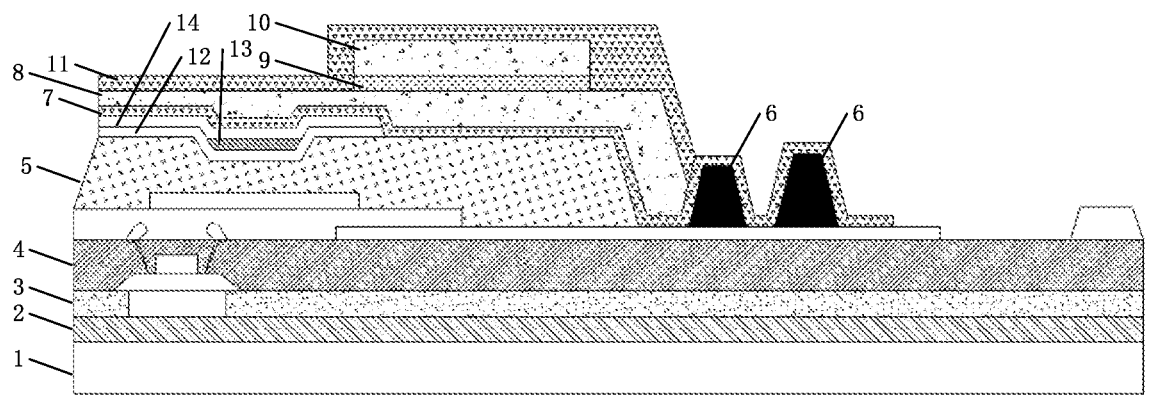
FIG. 1 is a schematic view of an organic light emitting diode display package structure according to embodiment 1 of the present invention.

As shown in FIG. 1, the present disclosure provides an organic light emitting diode display package structure, the organic light emitting diode display package structure includes a glass substrate 1, a polyimide substrate 2, a functional layer 3, a gate insulating layer 4, a pixel definition layer 5, a blocking wall 6, a first barrier layer 7, a first organic buffer layer 8, a first hydrophobic layer 9, a second organic buffer layer 10, and a second barrier layer 11 which are disposed sequentially.

It is characterized that the polyimide substrate 2 is disposed on the glass substrate 1. Specifically, a polyimide solution is coated on the glass substrate 1 by a polyimide coating machine to form the polyimide substrate 2 under a high temperature curing, and then performing a formation of the above film layers. Finally, the glass substrate 1 and the polyimide substrate 2 are separated from each other by a laser stripping technology to obtain a flexible active-matrix organic light-emitting diode (AMOLED) panel, thereby satisfying more requirements from customers.

It is characterized that the functional layer 3 is disposed between the polyimide substrate 2 and the gate insulating layer 4. The functional layer 3 includes: a hole transport layer, a luminous layer, and an electron transport layer. The hole transport layer is disposed on the polyimide substrate; the luminous layer is disposed on the hole transport layer; and the electron transport layer is disposed on the luminous layer. The hole transport layer controls the transport of holes so that the recombination of the holes and the electrons in the luminous layer are also controlled, thereby increasing luminous efficiency. The electron transport layer controls the transport of electrons so that the recombination of the electrons and the holes in the luminous layer are also controlled, thereby increasing luminous efficiency.

The gate insulating layer 4 has the pixel definition layer 5 and the blocking wall 6 disposed thereon.

Figure 2:
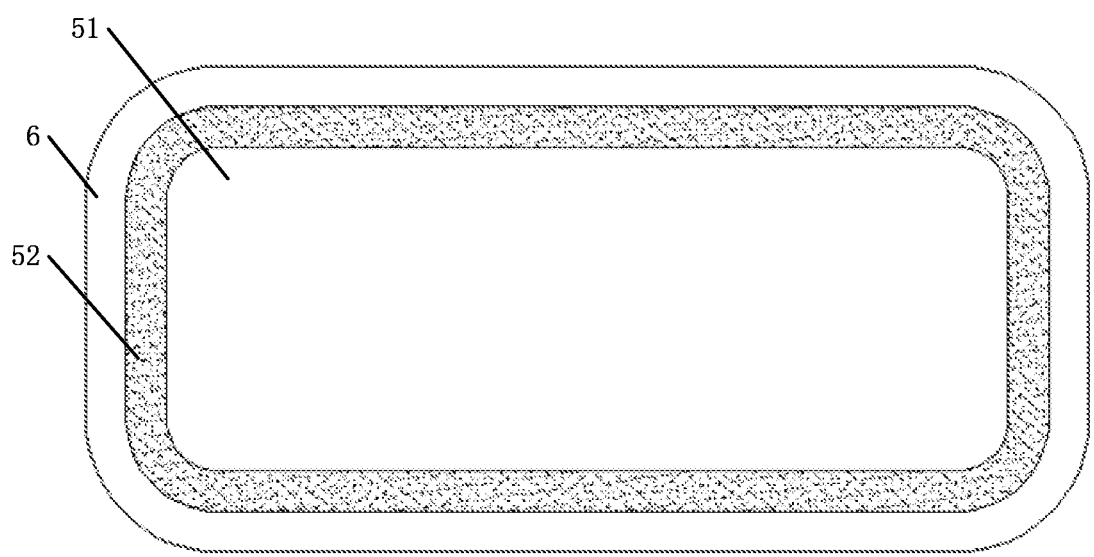
FIG. 2 is a schematic plan view of an OLED device.

As shown in FIG. 1 and FIG. 2, the pixel definition layer 5 includes an effective display area 51 and a working area 52. A surface of the effective display area 51 of the pixel definition layer 5 is provided with a first common layer 12, and electroluminous layer 13, and a second common layer 14 which are disposed sequentially; a working area is disposed between a boundary of an effective display area 51 of the pixel definition layer 5 and the blocking wall 6.

It is characterized that the first barrier layer 7 covers on the pixel definition layer 5 and the blocking wall 6.

It is characterized that the first organic buffer layer 8 is disposed on the first barrier layer 7 over the pixel definition layer 5. The first organic buffer layer 8 is made of one of an acrylic or an epoxy resin and the obtained first organic buffer layer 8 is extremely hydrophilic.

Figure 3:
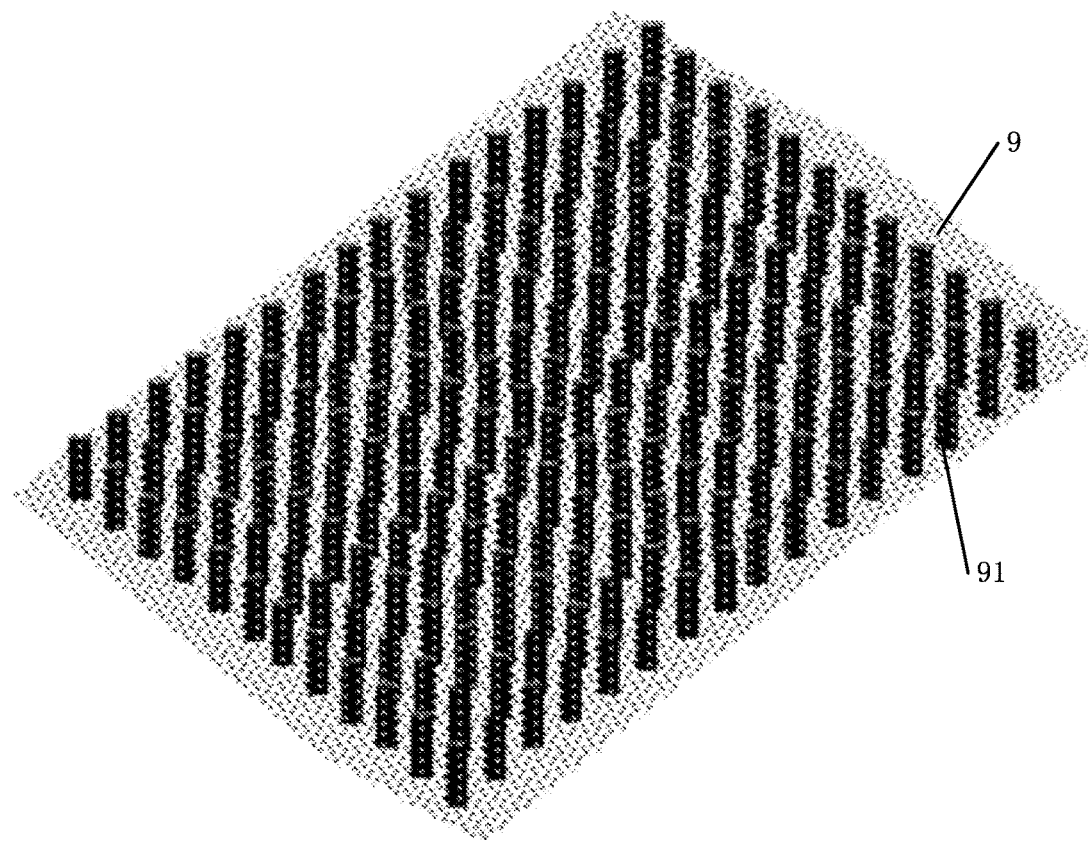
FIG. 3 is a schematic view of a hydrophobic layer having nano microstructures according to the present invention.

As shown in FIG. 1 and FIG. 3, the first hydrophobic layer 9 is disposed on the first organic buffer layer 8 over the working area 52 of the pixel definition layer 5. It is characterized that the first hydrophobic layer 9 is provided with nano microstructures 91 on a surface for limiting a boundary of the first organic buffer layer 8. Specifically, the first hydrophobic layer 9 is formed by depositing polytetrafluoroethylene through a physical vapor deposition. The nano microstructures on the surface of the first hydrophobic layer are formed by a plasma surface etching, and intervals between the nano microstructures on the surface of the first hydrophobic layer are less than or equal to 50 μm. If the intervals of the nano microstructure 91 are greater than 50 μm, the hydrophobic performance of the first hydrophobic layer 9 cannot be enhanced.

It is characterized that the second organic buffer layer 10 is disposed on the first hydrophobic layer 9. The second barrier layer 11 covers on the second organic buffer layer 10. It is characterized that the second organic buffer layer is made of one of an acrylic or an epoxy resin.

Embodiment 2

Only the differences between the present embodiment and the first embodiment will be described below, and the same portions will not be described herein.

Figure 4:
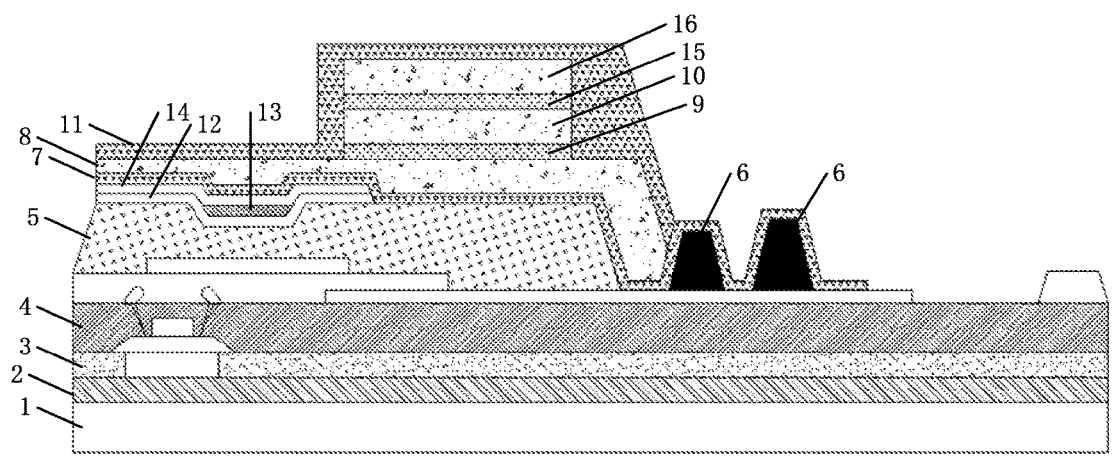
FIG. 4 is a schematic view of an organic light emitting diode display package structure according to embodiment 2 of the present invention.

As shown in FIG. 4, comparing to Embodiment 1, the organic light emitting diode display package structure further includes: a second hydrophobic layer 15, wherein a surface of the second hydrophobic layer 15 is provided with nano microstructures 91 for limiting a boundary of the second organic buffer layer 10 in this embodiment, and the second hydrophobic layer 15 is disposed on the second organic buffer layer 10; and a third organic buffer layer 16 disposed between the second hydrophobic layer 15 and the second barrier layer 11.

Figure 5:
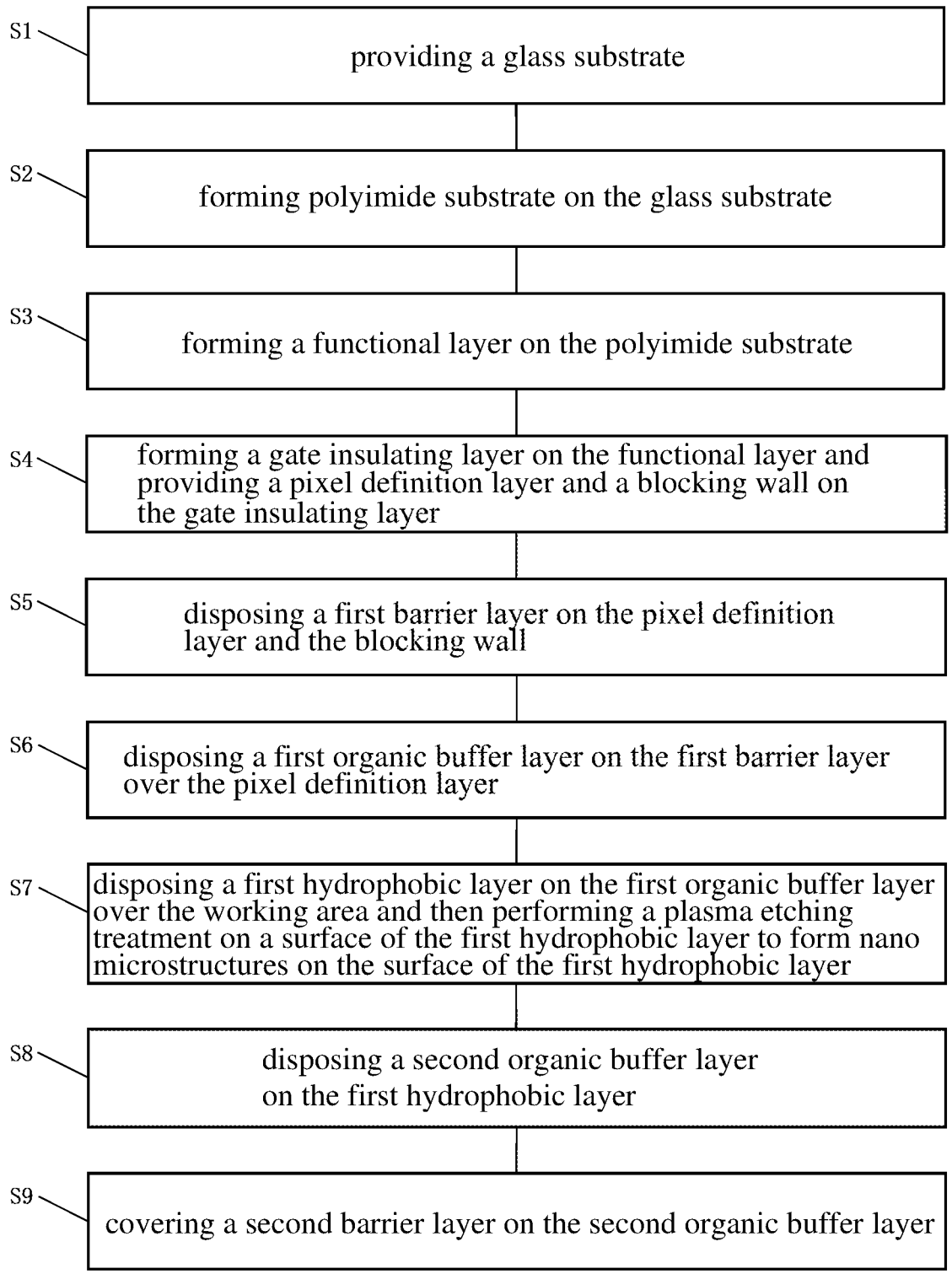
FIG. 5 is a manufacturing flow chart of an organic light emitting diode display package structure according to the present invention.

As shown in FIG. 5, a method of manufacturing an organic light emitting diode display package structure includes below steps. The components described in below steps are referred to and shown in FIG. 1 to FIG. 4.

S1: providing a glass substrate 1;

S2: coating polyimide on the glass substrate 1 by a polyimide coating machine to form a polyimide substrate 2 under a high temperature curing;

S3: forming a hole transport layer, a luminous layer, and an electron transport layer sequentially to obtain a functional layer 3 on the polyimide substrate 2 by a TFT technical process;

S4: forming a gate insulating layer 4 on the functional layer 3 by a TFT technical process and providing a pixel definition layer 5 and a blocking wall 6 on the gate insulating layer 4;

S5: disposing a first barrier layer 7 on the pixel definition layer 5 and the blocking wall 6;

S6: disposing a first organic buffer layer 8 on the first barrier layer 7 over the pixel definition layer 5;

S7: disposing a first hydrophobic layer 9 on the first organic buffer layer 8 over the working area of the pixel definition layer 5 and then performing a plasma etching treatment on a surface of the first hydrophobic layer 9 to form nano microstructures 91 on the surface of the first hydrophobic layer 9;

S8: disposing a second organic buffer layer 10 on the first hydrophobic layer 9; and S9: covering a second barrier layer 11 on the second organic buffer layer 10.

The present application has been described by the above related embodiments, but the above embodiments are merely examples for implementing the present application. It must be noted that the disclosed embodiments do not limit the scope of the present application. Rather, modifications and equivalent arrangements included in the spirit and scope of the claims are intended to be included within the scope of the present application.

What is claimed is:

1. An organic light emitting diode (OLED) display package structure, comprising:
    a gate insulating layer having thereon a pixel definition layer and a blocking wall, wherein a working area is disposed between a boundary of an effective display area of the pixel definition layer and the blocking wall;
    a first barrier layer covering on the pixel definition layer and the blocking wall;
    a first organic buffer layer disposed on the first barrier layer over the pixel definition layer;
    a first hydrophobic layer disposed on the first organic buffer layer over the working area, wherein the first hydrophobic layer is provided with nano microstructures on a surface for limiting a boundary of the first organic buffer layer;
    a second organic buffer layer disposed on the first hydrophobic layer;
    a second barrier layer covering on the second organic buffer layer;
    a second hydrophobic layer disposed on the second organic buffer layer, wherein a surface of the second hydrophobic layer is provided with nano microstructures for limiting a boundary of the second organic buffer layer; and
    a third organic buffer layer disposed between the second hydrophobic layer and the second barrier layer.

2. The OLED display package structure according to claim 1, wherein intervals between the nano microstructures on the surface of the first hydrophobic layer are less than or equal to 50 μm.

3. The OLED display package structure according to claim 1, wherein the nano microstructures on the surface of the first hydrophobic layer are formed by a plasma surface etching.

4. The OLED display package structure according to claim 1, wherein the first hydrophobic layer is deposited on the first organic buffer layer by a physical vapor deposition.

5. The OLED display package structure according to claim 1, wherein the first organic buffer layer includes one of an acrylic or an epoxy resin.

6. The OLED display package structure according to claim 1, wherein the first hydrophobic layer includes polytetrafluoroethylene.

7. The OLED display package structure according to claim 1, further includes:
    a glass substrate;
    a polyimide substrate disposed on the glass substrate; and
    a functional layer disposed between the polyimide substrate and the gate insulating layer.

8. The OLED display package structure according to claim 7, wherein functional layer includes:
    a hole transport layer disposed on the polyimide substrate;
    a luminous layer disposed on the hole transport layer; and
    an electron transport layer disposed on the luminous layer.

* * * * *